United States Patent [19]

Garcia et al.

[11] Patent Number: 5,140,351
[45] Date of Patent: Aug. 18, 1992

[54] REMOTE METER READING METHOD AND APPARATUS

[75] Inventors: Oscar Garcia, Sugarland; George Farmer, Houston, both of Tex.

[73] Assignee: Tel-Transfer Systems, Inc., Houston, Tex.

[21] Appl. No.: 485,281

[22] Filed: Feb. 22, 1990

Related U.S. Application Data

[63] Continuation-in-part of Ser. No. 89,354, Aug. 24, 1987, abandoned.

[51] Int. Cl.$^5$ .............................................. G02B 6/06
[52] U.S. Cl. ................................................... 385/117
[58] Field of Search ................ 350/96.25, 96.24, 96.26

[56] References Cited

U.S. PATENT DOCUMENTS

| | | | |
|---|---|---|---|
| 3,573,773 | 4/1971 | O'Hanion | 350/96.24 X |
| 3,639,747 | 2/1972 | Schmidt | 350/96.24 X |
| 3,990,778 | 11/1976 | Magee et al. | 350/96.25 |
| 4,734,918 | 3/1988 | Bauer et al. | 374/131 |

*Primary Examiner*—Frank Gonzalez
*Attorney, Agent, or Firm*—J. David Cabello

[57] ABSTRACT

A new and novel apparatus and method for remotely reading a meter, and more specifically a utility meter, is disclosed. In the present invention an apparatus is provided which can be used to remotely read a utility meter which is not affected by electro-magnetic interference (EMI) or radio-magnetic interference (RFI). In the present invention an apparatus for remotely reading a utility meter which is not susceptible to lightning strikes and voltage transients and surges is disclosed. The present invention employs a coherent-light fiber optic link operatively coupled between an image transmitter and an image receiver.

4 Claims, 7 Drawing Sheets

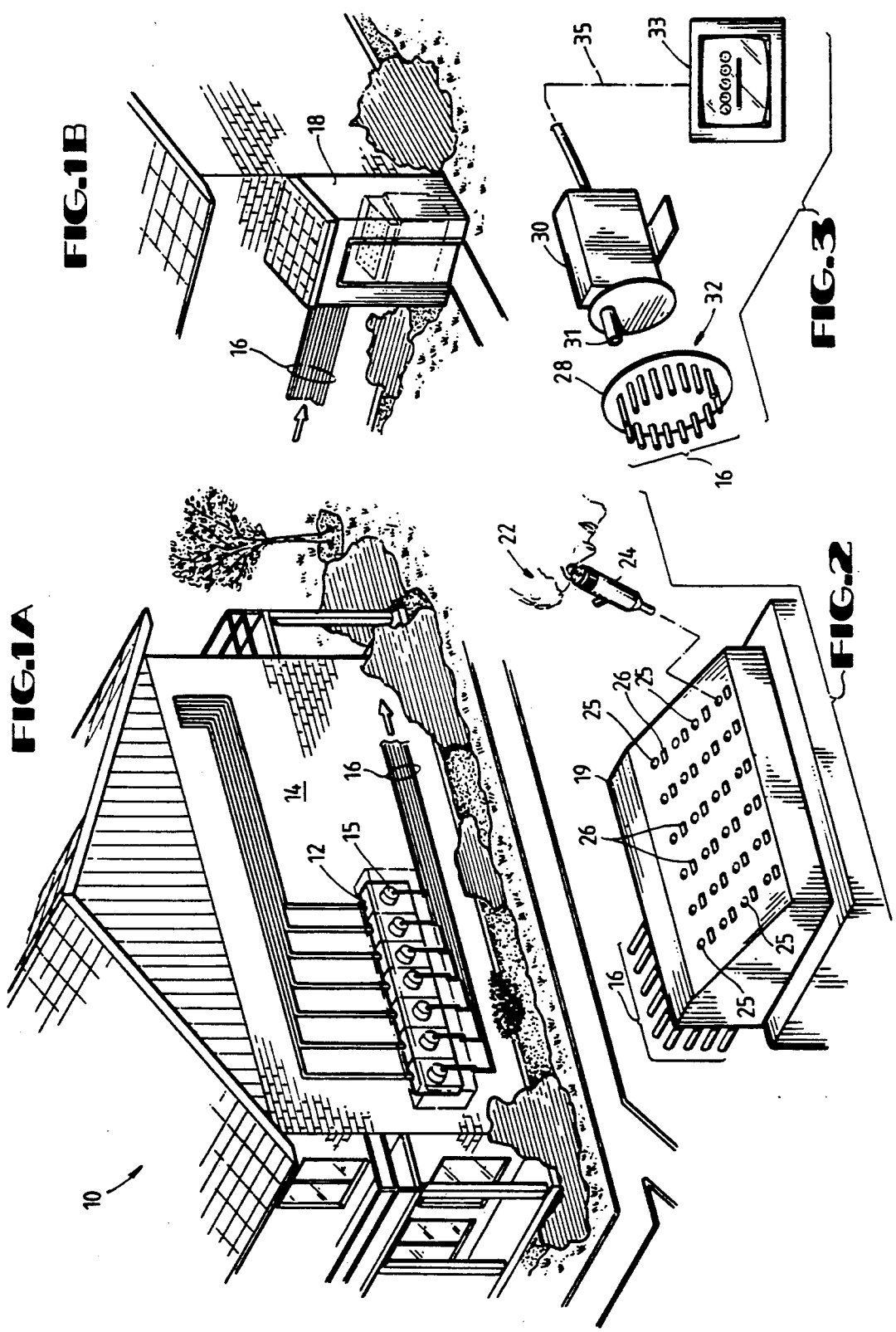

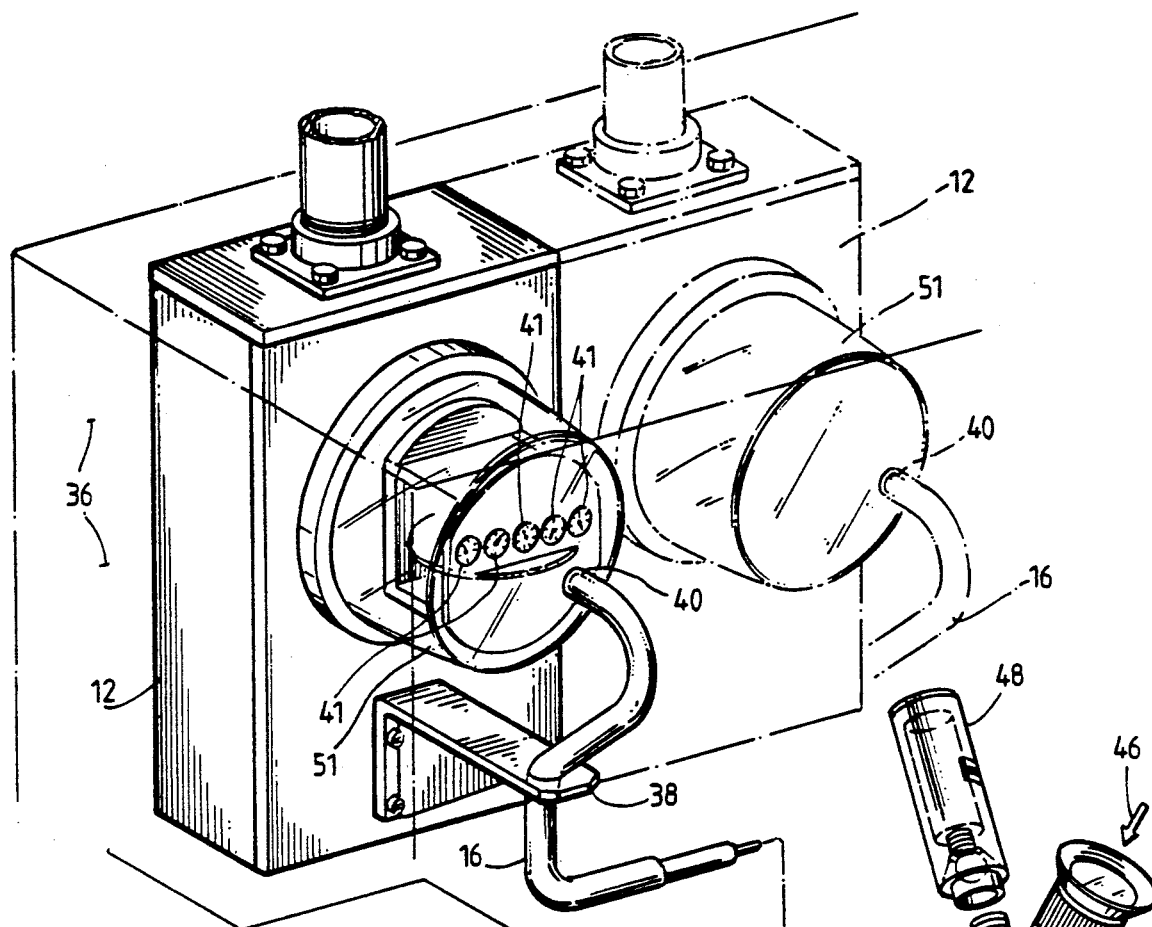
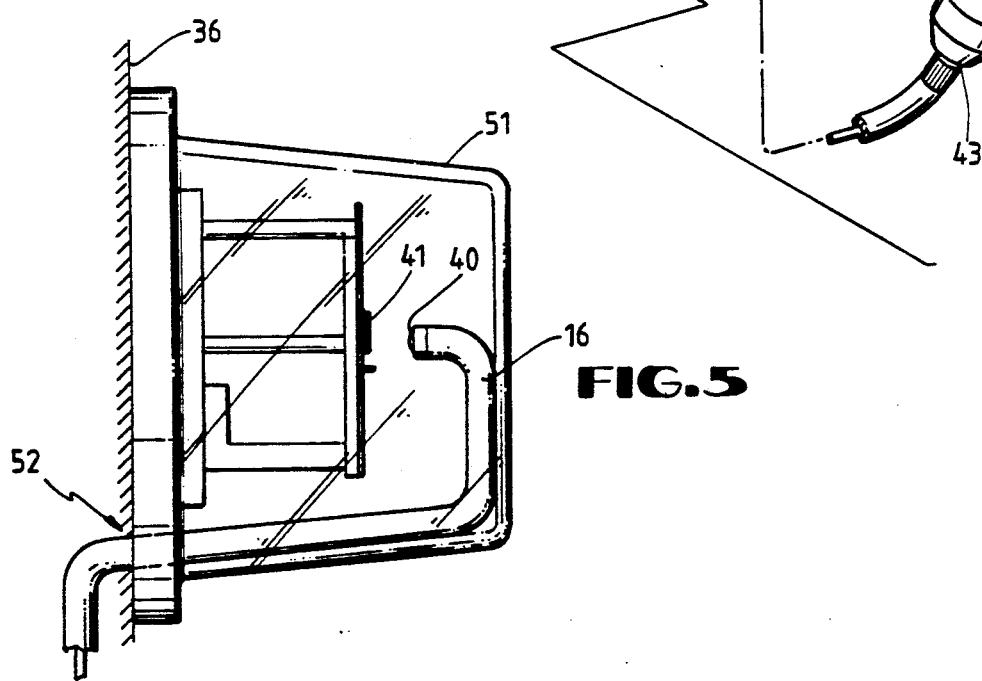

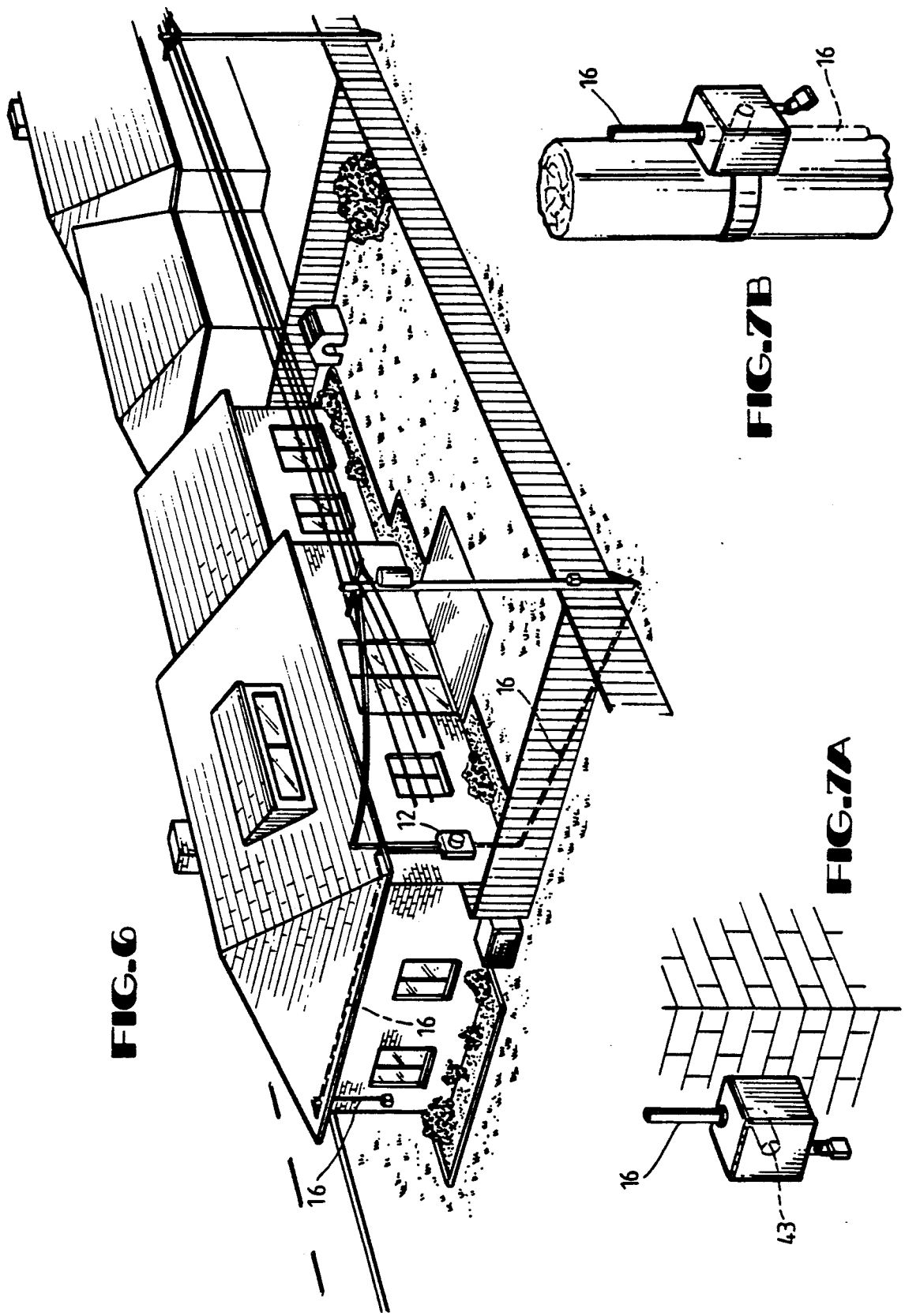

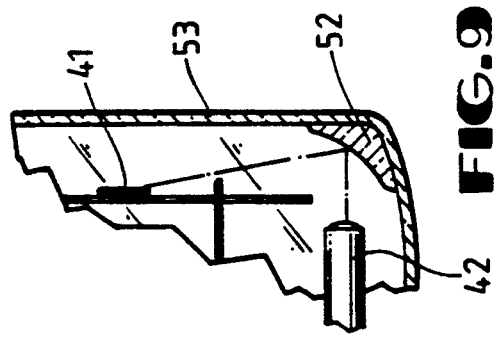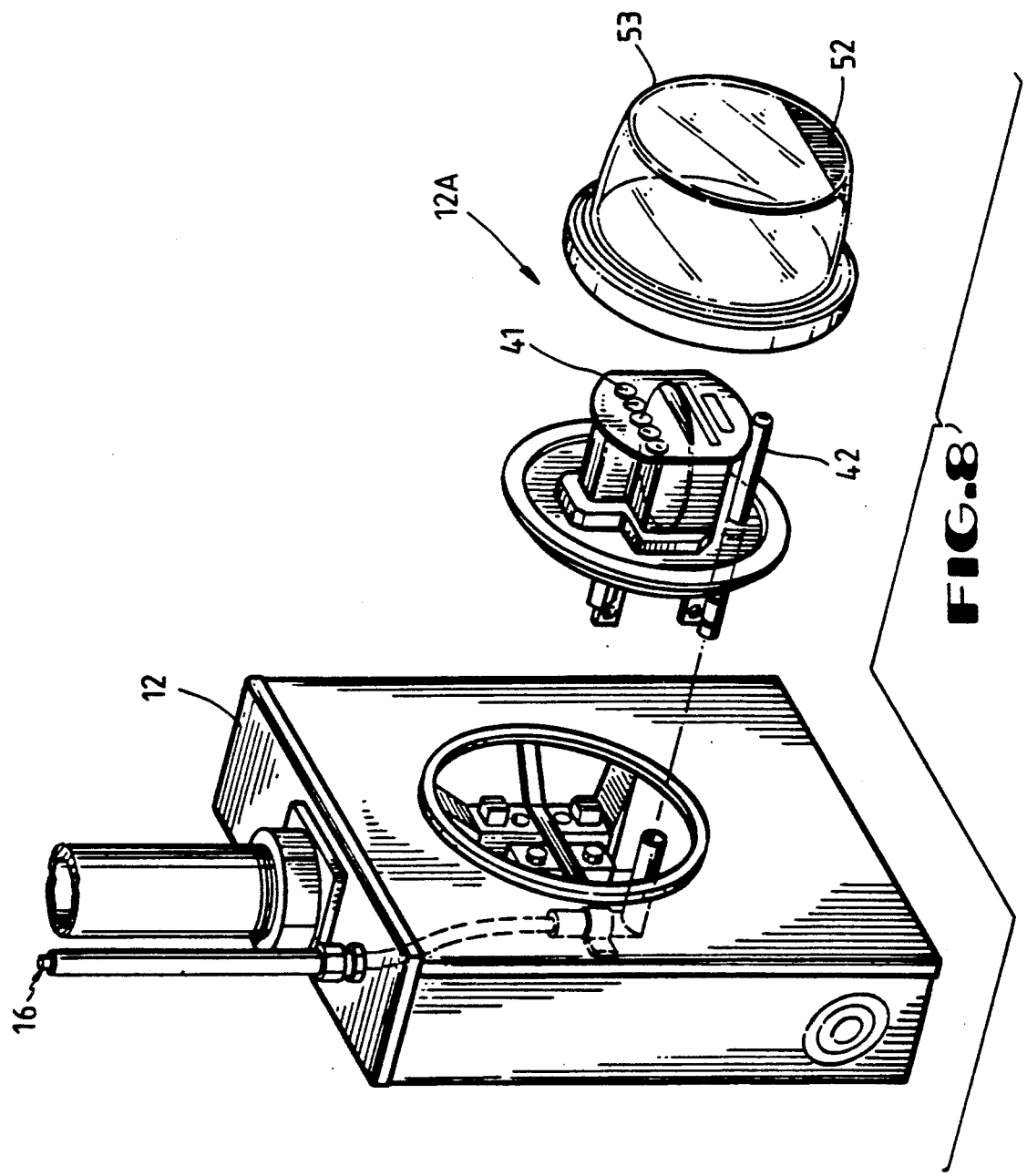

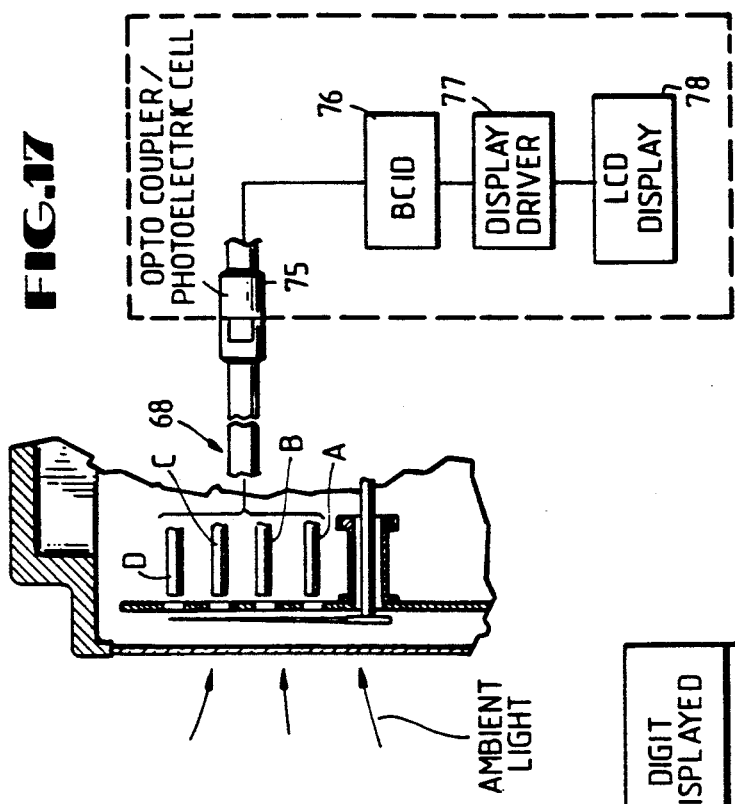
FIG.17
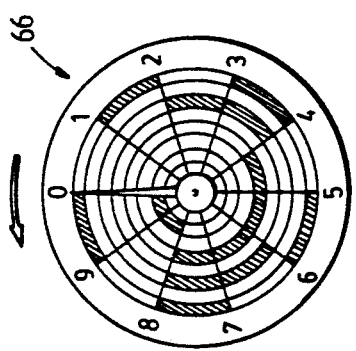
FIG.16
FIG.18
| FIBEROPTIC CONDUCTOR | | | | DIGIT DISPLAYED |
|---|---|---|---|---|
| A | B | C | D | |
| 0 | 0 | 0 | 0 | 0 |
| 0 | 0 | 0 | 1 | 1 |
| 0 | 0 | 1 | 0 | 2 |
| 0 | 0 | 1 | 1 | 3 |
| 0 | 1 | 0 | 0 | 4 |
| 0 | 1 | 0 | 1 | 5 |
| 0 | 1 | 1 | 0 | 6 |
| 0 | 1 | 1 | 1 | 7 |
| 1 | 0 | 0 | 0 | 8 |
| 1 | 0 | 0 | 1 | 9 |
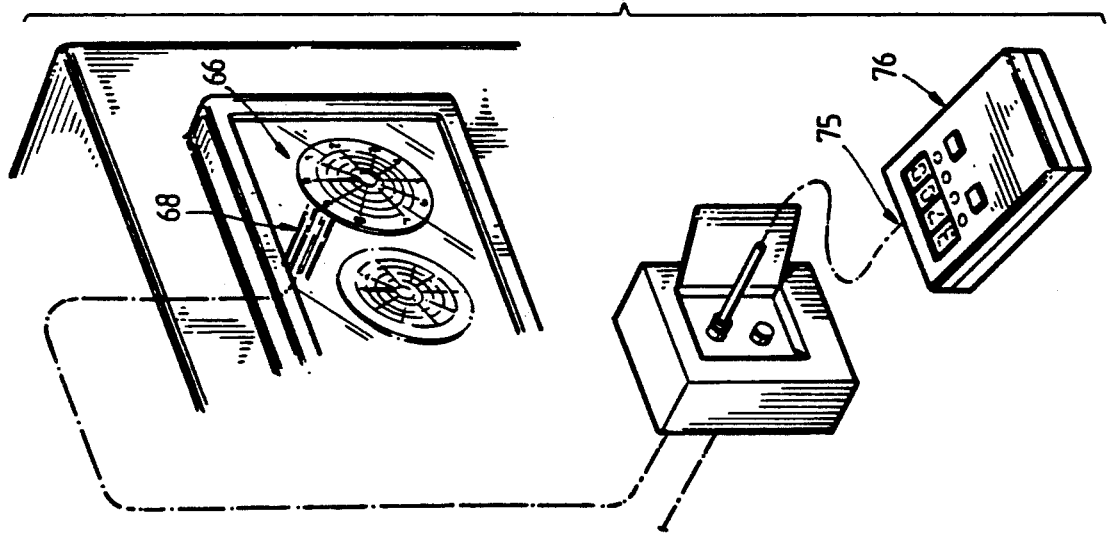
FIG.15

REMOTE METER READING METHOD AND APPARATUS

This is a continuation-in-part of copending application Ser. No. 07/089,354 filed on Aug. 24, 1987 now abandoned.

BACKGROUND OF THE INVENTION AND RELATED ART

This invention relates to an improved method and apparatus for reading a meter, and more particularly a utility meter, from a remote location.

Utility companies have long had what is considered to be "problem meters" or problem accounts because of the problems encountered in either reading or gaining access to the meter. In many cases the meter may be obstructed by debris or vehicles or access to the meter may be obstructed by domestic animals, locked doors or simply by a hostile consumer.

In some cases the utility meter, and more particularly a water meter, may be indoors due to the problems encountered with freezing temperatures and thus the access to the meter may only be obtained whenever the consumer is at home and willing to permit the meter reader to gain access to the meter. In some cases particularly in cases of elderly and security conscious persons sometimes a meter reader is denied access to the meter thus requiring the meter reader to return at a later date or waste valuable time convincing the consumer that the meter must be read.

In other cases devices have been developed to remotely read a utility meter, however these have required an electronic transmitter and receiver, carrier signals or have been overly complex thus requiring a high degree of skill to maintain and with a resulting high maintenance and operating budget which offsets any benefits to be derived from such devices. One such apparatus was recently described in U.S. Pat. No. 4,680,704 titled "Optical Sensor Apparatus and Method for Remotely Monitoring a utility Meter or the Like".

Utility companies have not been receptive to the implementation of transmitter/receiver type apparatus and/or carrier-line apparatus because of the expense involved in implementing such a system and also because of the expense and time and expense involved in keeping such a system calibrated and operating accurately.

Utility companies have further refrained from using transmitter/receiver and carrier line devices because of their susceptibility to electrical interference. The tendency for transmitter/receiver devices to be subjected to electrical interference results in the consumer and utility company giving little to no credence to the accuracy of the devices and the dependability of the devices. In applications where the accuracy is critical i.e. revenue-producing applications and petro-chemical type applications accurate and dependable readings must be assured every time.

SUMMARY OF THE INVENTION

In the preferred embodiment of the present invention a new and novel method and apparatus for remotely reading a meter, and more specifically a utility meter, is disclosed. It is an object of the present invention to provide an apparatus which can be used to remotely read a utility meter which is not affected by electromagnetic interference (EMI) or radio-magnetic interference (RFI). It is a further object of the present invention to provide an apparatus for remotely reading a utility meter which is not susceptible to lightning strikes and voltage transients and surges.

It is a further object of the present invention to provide an apparatus which has no moving parts, can be manufactured at a relatively low cost, requires little or no maintenance and has a high degree of accuracy.

In the present invention a viewing telescopic lens which is employed as the image receiver. This telescopic lens is also referred to as a magnifier or eye-piece and is linked by means of an image transferring link such as a coherent-light fiber-optic fiber to an image transmitter such as an objective telescopic lens. This image transmitter is also referred to as a telescopic imaging system and is positioned on the exterior of the meter, thus permitting the face of the meter to be viewed and consequently the face of the meter to be read by a meter reader at a remote location. In another embodiment of the present invention the telescopic imaging system is positioned on the interior portion of the meter in a manner to minimize tampering and vandalism. The telescopic imaging system may directly read the visual image on the face of the meter or may in some cases employ a image reflecting surface to transfer the image from the face of the meter to the image transferring link.

In yet another embodiment of the present invention a cyclometer-type (similar to an odometer on an automobile) utility meter is used with a matrix of x by y pixels or fibers in a coherent light fiber link assigned to each digit of the cyclometer. The matrix of x by y fibers or pixels are used to read each digit as it is presented on the cyclometer or meter face. In order to increase the resolution of the remote reading apparatus the product of x by y may be increased. Resolutions which are acceptable may be obtained through the use of a 5 by 7 matrix.

In another embodiment of the present invention, separate light fibers are used for each digit to be read on a particular dial with a light pipe assigned to each cluster of digits which are to be read on a particular dial.

The present invention provides for the meter image to be transferred in a static manner and thus minimizes the potential for errors caused by EMI and RFI interference and requires no calibration of the apparatus used to remotely transfer the image.

The present invention further provides an auxiliary light unit which permits the meters to be read in low-light and no-light conditions.

The present invention further permits meter reading to occur from a central location even though the meters are not centrally located and from a remote location where a meter is located in an area commonly inaccessible to the meter reader.

It is a further object of the present invention to provide a utility meter reading device which does not require that a meter reading be transferred by some sort of magnetic-coupling apparatus or capacitive-coupled apparatus wherein the utility lines themselves are used as a carrier for the meter reading.

The present invention further provides for effective and accurate meter reading without the need for additional electrical conductors which are commonly susceptible to environmental problems such as moisture and inductive errors from induced and stray voltages and currents. The present invention also provides for a quick and easy installation in that no adjustments are required for field variable parameters such as distance.

Is is a further object of the present invention to provide a means to remotely read gauges and other industrial totalizers and meters, whether revenue producing or non-revenue producing, particularly in extremely dangerous environments such as petro-chemical facilities and munitions facilities.

The present invention is also particularly well suited for reading measured parameters in nuclear power plants and the like where a gauge or meter may be mounted in a radioactive or hazardous environment by permitting such a gauge or meter to be read remotely from the radioactive or hazardous environment; thus minimizing the exposure of the meter or gauge reader to the radioactive or hazardous environment.

BRIEF DESCRIPTION OF THE DRAWINGS

FIG. 1A is a partial elevation illustrating a plurality of utility meters mounted on the exterior portion of a wall with a telescopic imaging system mounted on the exterior portion of the meter with the fiber-optic fibers routed to a remote location.

FIG. 1B is a partial elevation illustrating the fiber-optic fibers which are routed from remotely located utility meters to a centrally located meter readers, shack where a meter reader may obtain central access and read the remotely mounted meters.

FIG. 2 is an enlarged view of a panel where the fiber-optic fibers are terminated in a manner which will permit a meter reader to quickly and conveniently read a plurality of remotely mounted meters from a single remote location.

FIG. 3 is another method of terminating a plurality of fiber-optic fibers in a manner which will permit a meter reader to rotate a single eyepiece to read a plurality of remotely mounted meters. The eye-piece illustrated in FIG. 3 is coupled to a closed-circuit camera and displayed on a cathode ray tube.

FIG. 4 is a detailed elevational view of a utility meter and more particularly a power meter with the magnifying imaging section mounted on the exterior portion of the meter.

FIG. 5 is a detailed sectional view of a utility meter and more particularly a power meter with the magnifying imaging section mounted on the interior portion of the meter.

FIG. 6 is an elevational view illustrating a typical installation in a suburban setting where the utility meter is located at the rear of a home. Typical obstructions such as a fence are likewise illustrated.

FIG. 7A is an elevational view illustrating one method of remotely mounting the viewing end of the fiber optic system.

FIG. 7B an elevational view illustrating yet another method of remotely mounting the viewing end of the fiber optic system 1.

FIG. 8 is an elevational partly exploded view of a utility meter illustrating a typical vandal resistant installation with the fiber optic fiber entering from the rear portion of the meter and employing a series of image reflecting mirrors.

FIG. 9 is a cross-section of the protective glass shield of a kilo-watt hour meter illustrating in detail the image reflecting mirror.

FIG. 15 is a simplified view of an alternate embodiment of a meter with a rotating dial illustrated in FIG. 16, wherein a BCD decoder is used to display a digital image.

FIG. 16 illustrates a rotating dial with partially shaded concentric bands.

FIG. 17 is a decoding means for decoding the optical image from the rotating dial illustrated in FIG. 16 to the digital value illustrated in FIG. 18.

FIG. 18 is a decoding table for the rotating dial depicted in FIG. 15.

DETAILED DESCRIPTION OF THE PREFERRED EMBODIMENT

Figure 10:
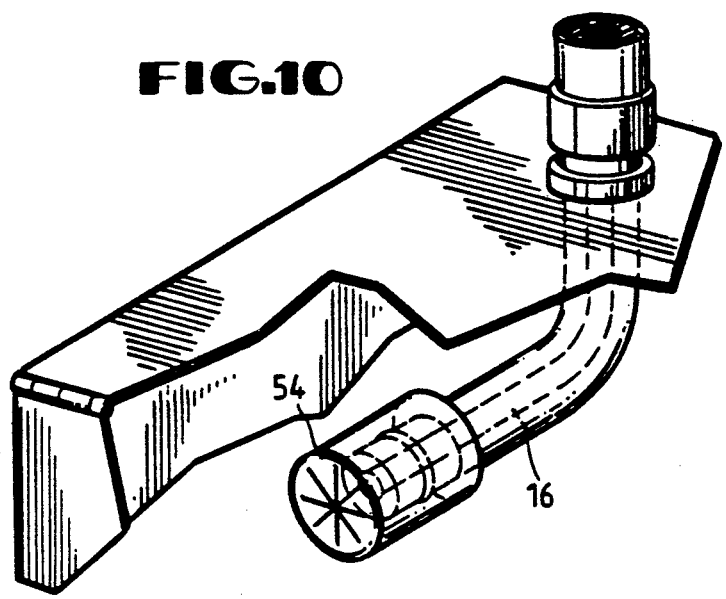
FIG. 10 is a partial elevational of one method of terminating the viewing end of the fiber optic fiber.

The invention will be described with reference to a preferred embodiment and more particularly with reference to a power meter. It is to be understood that this is merely one of the preferred embodiments and that the invention is viewed as applying equally to all remotely mounted meters and gauges whether revenue producing or non-revenue producing.

Turning now to the figures and more particularly to FIG. 1A an elevational view of an apartment complex 10 with a plurality of utility meters 12 is illustrated. This illustration applies equally as well to other multi-family dwellings such as townhouses and condominiums and to multi-occupant facilities such as strip shopping centers and shopping complexes. The plurality of utility meters 12 are mounted on the exterior portion of a wall 14 with a telescopic imaging system 15 mounted on the exterior portion of the meter with a plurality of fiber-optic fibers 16 routed to a remote location. In this embodiment one fiber-optic fiber corresponds to each utility meter, however it is to be understood by one skilled in the art having the benefit of this disclosure that a multi-fiber fiber-optic link may be used in lieu of a plurality of fiber-optic fibers.

Turning now to FIG. 1B a partial elevation of a meter-reader's shack 18 is illustrated. The fiber-optic fibers 16 are routed from remotely located utility meters 15 to the centrally located meter readers' shack 18. The centrally located meter readers' shack 18 permits a meter reader to gain access to the readings of a plurality of meters and permits the meter reader to read the remotely mounted meters all without any transmitter/receiver pairs or carrier-line apparatus.

Referring now to FIG. 2, a terminating panel 19 is shown with the plurality of fiber-optic fibers entering the rear of the panel. The fiber-optic fibers are terminated in such a manner that a meter reader 22 may use a single eye-piece 24 to read the plurality of meters. As is illustrated in FIG. 2, the terminus of the individual fiber optic fibers 25 are labeled with a label 26 which corresponds to the meter to which the opposite end is coupled.

Referring now to FIG. 3, another method of terminating the plurality of fiber-optic fibers is illustrated. In the embodiment illustrated in FIG. 3, the plurality of fiber-optic fibers 16 are terminated on a circular plate 28. A closed-circuit television camera 30 is mounted in a manner that the viewing lens 31 of the television camera 30 is focused on the terminus 32 of the fibers 16. A closed circuit television 33 is coupled to the camera 30 by means of a coaxial cable 35 or other means well known in the art. The television 33 thus permits a meter or gauge to be read accurately over long distances using conventional image transferring systems and/or to be viewed simultaneously by a plurality of viewers in the event that more than on television 33 is connected to the camera 30. By rotating the viewing lens 31 about the circumference of the circular plate 28 in discrete steps which correspond to terminus 32 of each of the fiber-optic fibers 16, each fiber-optic fiber may be viewed. Thus the image which is presented at the end opposite the terminus of the fiber-optic fibers may be viewed.

Turning now to FIG. 4, a detailed elevational view of one embodiment of the present invention is illustrated. In FIG. 4 an electric power meter (kilowatt-hour meter) is mounted on a vertical surface 36. It is to be understood that one skilled in the art having the benefit of this disclosure may substitute a water meter or other revenue meter and/or a process-control meter or gauge for the meter 12 illustrated in FIG. 4.

As is shown in FIG. 4, a bracket 38 is rigidly attached to the exterior portion of the utility meter 12 by means of brazing or other similar means. A fiber-optic fiber 16 is secured to the bracket 38 in a manner which will permit the first terminus 40 of the fiber-optic fiber to remain un-obscured. This first terminus serves the function of an image transmitter and is used to capture the image presented to it and transmit it to the remote receiver via the image transfer link. The first terminus 40 of the fiber-optic fiber is equipped with a wide-angle telescopic lens which has an appropriate focal length to permit focusing on the plurality of dial gauges 41 on the utility meter 12.

The second terminus 43 of the fiber-optic fiber 16 is located remotely from the utility meter 12. This second terminus serves the function of an image receiver and is used to receive and display the image presented to it by the image transfer link, or more specifically, the image presented to the image transmitter at the first terminus of the image transfer link. The second terminus 43 may be terminated as is shown in FIG. 4 with a fixed eye-piece 45 or in the manner shown in FIG. 2 or in the manner shown in FIG. 11B or in any other manner similar manner. The image presented by the dials 41 on the remote utility meter 12 may be viewed by peering in the eye-piece 45 as is shown by the arrow 46.

In the event of low-light conditions an auxiliary light unit 48 may be removably adapted to the illumination adapter 49 in order to provide auxiliary illumination at the eye-piece 45. The auxiliary illumination is carried to the remote image by means of some of the fibers in the fiber optic fiber 16 which are tied to the auxiliary illumination adapter 49 and returned by means of other fibers which are terminated in the eye-piece.

Referring now to FIG. 5 an alternate method of mounting the first terminus of the fiber-optic fiber is illustrated. In the embodiment shown in FIG. 5 the fiber-optic fiber 16 is mounted within the utility meter housing 51 and routed out of the back 52 of the meter housing in order to reduce the possibility of tampering and vandalism. Other reference numerals illustrated in FIG. 5 correspond to the reference numerals illustrated in FIG. 4 and the description set forth for FIG. 4 is likewise applicable to FIG. 5.

Turning now to FIG. 6 a perspective view illustrating a typical installation in a suburban setting is depicted. As is shown in FIG. 6 the utility meter 12 is located at the rear of a home. Typical obstructions such as a fence are likewise illustrated. The image transferring link 16 is shown as an under eve installation and as an underground installation In the event that the image transferring link 16 is installed under eve a method of terminating the image transfer link such as that shown in FIG. 7A may be used.

Turning now to FIG. 7A an elevational view illustrating one method of remotely mounting the viewing end of the fiber optic system is illustrated. An eye-piece 45 such as that shown in FIG. 4 may be used in conjunction with the receiving end 43 as shown in FIG. 7A. In the alternative a magnifying lens such as that shown in FIG. 11A may be used to magnify the image to be read by a meter reader.

Turning now to FIG. 7B an elevational view illustrating yet another method of remotely mounting the viewing end of the fiber optic system. The methods of terminating the viewing end described for FIG. 7A is also applicable to FIG. 7B.

Referring now to FIG. 8 an elevational partly exploded view of a utility meter is illustrated which shows a typical vandal resistant installation with the fiber optic fiber or image transferring link 16 entering from the rear portion of the meter and employing a series of image reflecting mirrors 52 and 42A. The image transfer link 16 is shown entering the top of the meter housing 12. As is shown in FIG. 8 the meter 12A is plugged into the meter housing. The viewing lens 42 is installed on the removable portion of the kilowatt-hour meter and is removed from the meter housing at the same time the kilowatt-hour meter is removed from the housing.

In order to facilitate the insertion and removal of the viewing lens 42 from the housing at the time the kilowatt-hour meter is removed a slip-joint feature is employed. The slip-joint feature is more specifically illustrated in FIG. 11A.

Figure 11A:
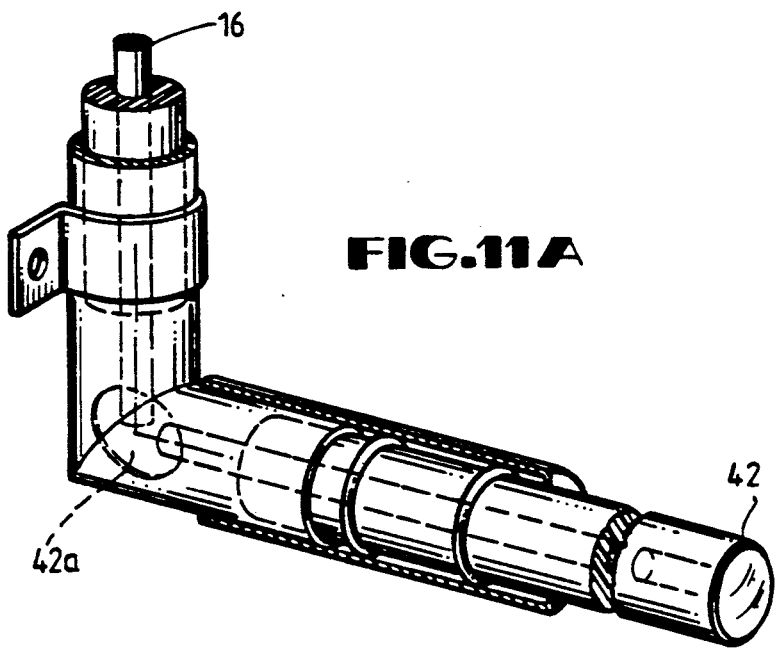
FIG. 11A is a detailed elevational view of a means of installing the fiber-optic cable on the rear portion of the meter housing, as illustrated in FIG. 8, which permits the meter with integral viewing lens to be removed from the meter housing.

As is shown in FIG. 11A an image reflector 42A is positioned at the rear portion of the slip-joint conduit to permit the image presented to the viewing lens or image transmitter to be turned or rotated and subsequently transmitted via the fiber optic cable 16. In the preferred embodiment the reflective surface 42a is a highly ground and polished mirror but any reflective surface which can transfer an image with little to no distortion is also suitable.

Turning now to FIG. 9 a cross-section of the protective glass shield 53 of a kilo-watt hour meter is depicted which illustrates in detail the image reflecting mirror 52 on the front portion of the protective shield 53. Also shown in FIG. 9 is the viewing lens or transmitter 42.

As will be appreciated from an inspection of FIG. 9 the image is transferred from the meter dials 41 on the front of the meter to the viewing lens or transmitter 42 by the reflective surface 52. In the preferred embodiment the reflective surface is a highly ground and polished mirror but any reflective surface which can transfer an image with little to no distortion is also suitable.

FIG. 10 is a partial elevational of one method of terminating the viewing end of the fiber optic fiber. Such a method may be employed in a receiver terminating box such as that shown in FIGS. 7A or 7B. As is shown in FIG. 10 the fiber-optic link 16 is terminated but is not provided with a magnifier or other means to view the image transmitted via the imaging link 16. This type of termination results in a much more economical installation in that the more expensive optical components such as an eye-piece 45 or magnifying lens 60 (shown in FIG. 11B) are not installed on the fiber-optic link 16, but are carried by the meter reader and manually inserted into the rosette cover 54 shown in FIG. 10. In this manner vandalism, tampering and theft of the more expensive optical components can be minimized.

Turning now to FIG. 11A a detailed elevational view of a means of installing the fiber-optic cable on the rear portion of the meter housing, as illustrated in FIG. 8 is shown. The installation method illustrated in FIG. 11A permits a meter with integral viewing lens 42 to be removed from the meter housing at the time the kilowatt-hour meter is removed from the meter housing. This is facilitated by means of a slip-joint mechanism installed with a series of o-rings into a cooperating receiving tube which has a diameter larger than the diameter of the fiber-optic slip joint. The reflective surface 42A functions in the manner previously described.

Figure 11B:
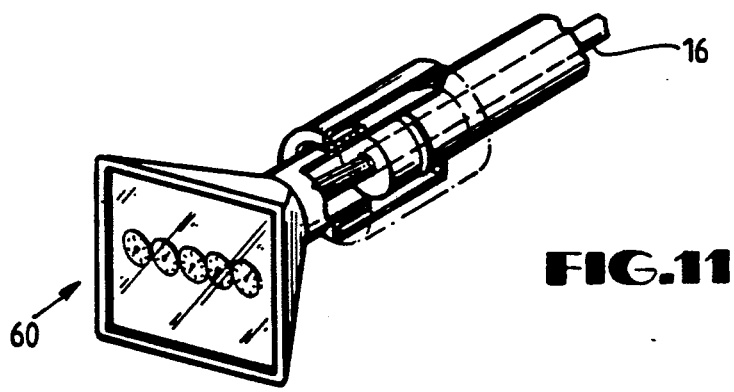
FIG. 11B is a detailed elevational view of a means for terminating the receiving end of the fiber-optic link with an integral magnifying lens for remotely viewing the image transmitted by the fiber-optic link.

FIG. 11B is a detailed elevational view of a means for terminating the receiving end of the fiber-optic link with an integral magnifying lens. As described in connection with the description of FIG. 10 the magnifying reading lens 60 may be inserted and removed at the time the meter reader reads the meter. This type of installation permits the meter reader to carry the more expensive optical components rather than having them permanently installed where they may be subjected to vandalism, theft and the elements such as heat and moisture. The magnifying reading lens is used to remotely view the image transmitted by the fiber-optic link while simultaneously enlarging said image.

ALTERNATE EMBODIMENTS

Figure 12:
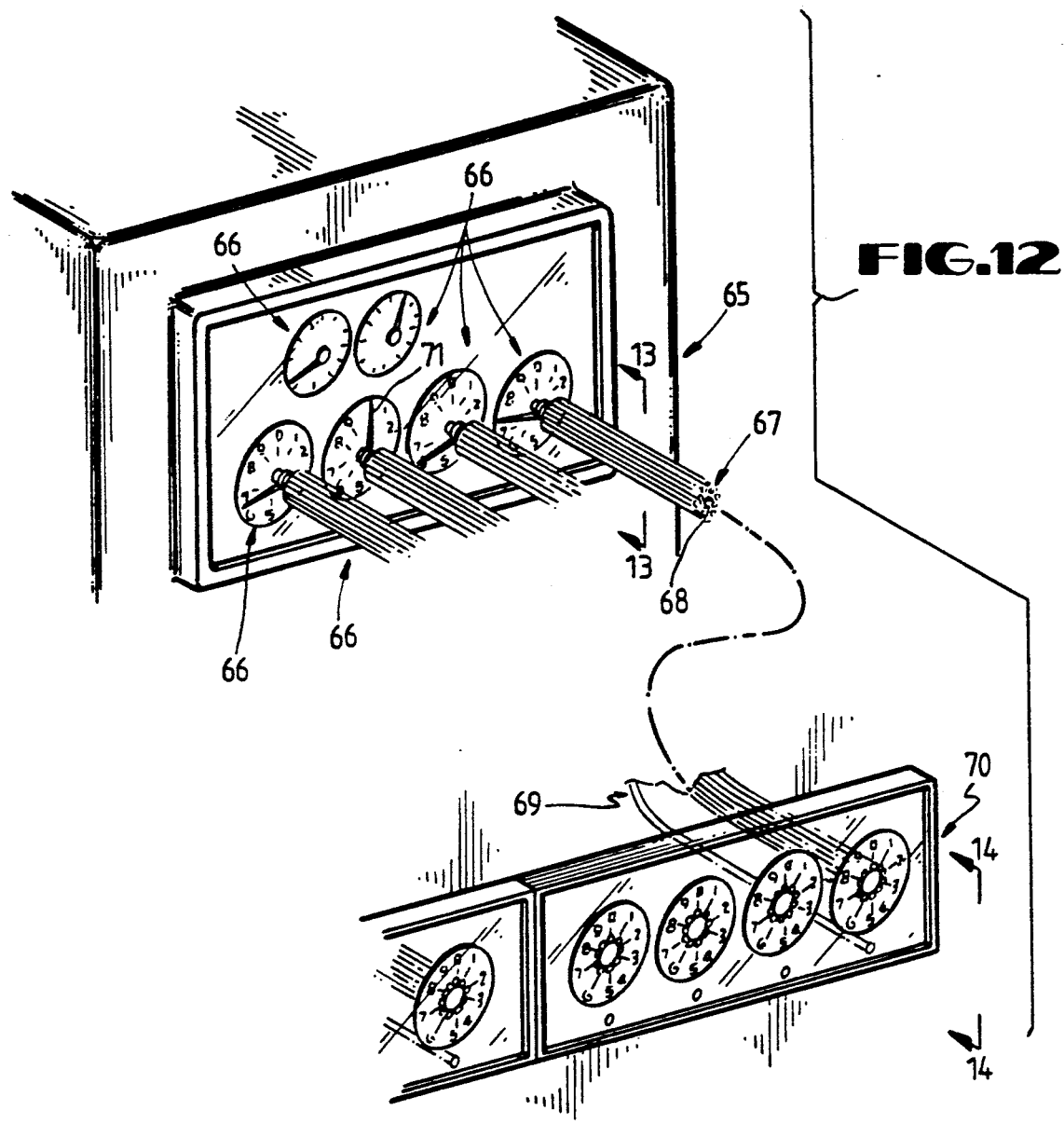
FIG. 12 illustrates a utility meter face with a fiber bundle affixed to a planar surface in front of four of the six dials on the meter and the remote reading head for the four dials.
Figure 13:
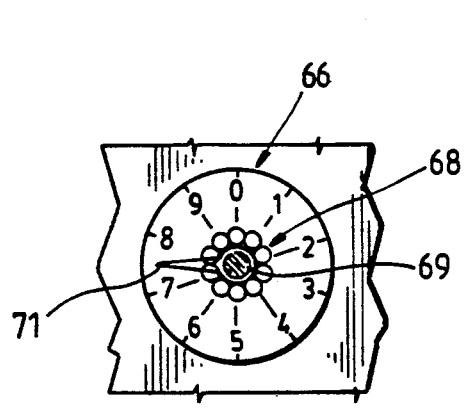
FIG. 13 is an enlarged view of the utility meter face illustrated in FIG. 12.

Referring now to FIG. 12, a meter face 65 consisting of six dials 66 is illustrated. Four of the six dials 66 have a light fiber bundle 67 affixed over the dial 66 and centered about the centerline of the dial 66. The light fiber bundle 67 preferably consists of ten light fibers 68 and a light pipe 69. The arrangement of the light fibers 68 over the dial 66 is illustrated in a larger scale in FIG. 13. Note that each of the light fibers 68 corresponds to each one of the digits on the dial 66. FIG. 13 also illustrates the light pipe 69 superimposed over the centerline of the dial 66.

Figure 14:
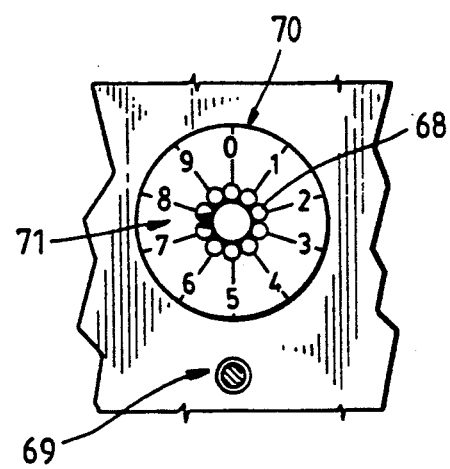
FIG. 14 is an enlarged view of the remote reading head illustrated in FIG. 12.

Referring now to FIG. 14, the arrangement of the light fibers 68 at the remote reading head 70 is illustrated. The remote reading head 70 is further illustrated in FIG. 12. Also illustrated in FIG. 14 is the light pipe 69. In a typical installation, where lighting conditions requires that a supplemental light source be used to read the utility meter, a concentrated light source such as that from a flashlight would be focused onto the light pipe 69 at the remote reading head 70. The light pipe 69 would provide sufficient lighting at the dial 66 on the meter face 65. As is further shown in FIG. 13 the position of needle 71 between digits 7 and 8 and dial 66 would be shown as a shadow between digits 7 and 8 on dial 66a of the remote reading head 70. In a similar manner other needle 71 positions on dial 66 would be illustrated.

The foregoing arrangement of a ten fiber bundle would be duplicated from each dial 66 to be read. FIG. 12 illustrates the arrangement for four dials, however, the arrangement of a ten fiber bundle has no inherent limitations.

Where ambient light conditions dictate, the light pipe 69 may be eliminated.

In yet another alternate embodiment, illustrated in FIG. 15, a utility meter is modified in a manner wherein the needle is stationary and the dial 66 (illustrated in FIG. 15 and 16) rotates about the stationary needle. The circular dial 66 is further encoded to represent a binary code for each position on the dial. Referring now to FIGS. 15 and 16, the ten positions on dial 66 are represented as a binary image by four concentric rings on the dial. The ten discrete digits on the dial can be represented by the 4-bit binary conversion table in FIG. 18.

The dark bands on the dial 66 are detected by a light fiber 68 which is optically coupled to a photoelectric diode 75. The photoelectric diode 75 is electrically connected to a BCD (Binary coded decimal) converter 76 which is used to convert the image detected by the light fibers 68 to one of the ten binary representations set out in the table depicted in FIG. 18.

Referring now to FIG. 17, the BCD converter 76 is electrically coupled to a display driver 77 which is coupled to a visual display element 78 such as a liquid crystal display (LCD or light emitting diode (LED) which is used to display the digit corresponding to the binary value set out in the table depicted in FIG. 18.

In a similar fashion each dial of a meter may be displayed by means of a four fiber bundle wherein the ten digits on a dial are converted to a binary image and the binary image displayed as a value on a remote display.

As can be appreciated by one skilled in the art, the above detailed description describes only one specific embodiment of the present invention. The apparatus can be readily adapted from a device to remotely read a utility meter to a device to remotely read a process-control meter. Additionally the embodiment described can be adapted from a device to remotely read a dial type meter to a device to read a cyclometer-type meter which displays numerals much like an odometer. Various components may be replaced by other mechanical or electro-mechanical equivalents to accomplish the same result, particularly in view of the interchangeable nature of such devices and their functions in the present invention. Variations and modifications of the invention will become obvious from the drawings and specification. Accordingly, the present invention should be limited only by the scope of the appended claims.

What I claim is the following:

1. A remote meter reading apparatus for transferring alphanumeric information to a remote location comprising:
   a) a dial which rotates about a fixed needle;
   b) at least one partially shaded concentric band affixed to said dial to represent discrete locations on said dial;
   c) means to detect the presence or absence of the shaded concentric band with at least one fiber optic element;
   d) means to transmit the image detected by the fiber optic element to a remote location;
   e) means to decode the image detected by the fiber optic element; and f) means to display the decoded image on a display element.

2. The apparatus set forth in claim 1 wherein four concentric bands and four fiber optic elements are used and the image is decoded into a four-bit signal for display as a digit with a value between 0 and 9.

3. A remote meter reading apparatus for transferring alphanumeric information to a remote location comprising:
   a) a stationary dial with at least ten digits on the face of said dial;
   b) a rotating a needle to indicate a value on the face of said dial;
   c) at least ten fiber optic elements affixed about the centerline of the dial wherein said fiber optic elements are positioned to detect the presence or absence of the rotating needle;
   d) means to transmit the image detected by the fiber optic elements to a remote location; and
   e) a remote reading head, wherein the fiber optic elements are arranged to correspond to the digits on the face of the dial.

4. The apparatus set forth in claim 3 further comprising a light pipe to provide an auxiliary light source at the dial.

* * * * *